United States Patent
Bernstein et al.

(10) Patent No.: US 7,692,944 B2
(45) Date of Patent: Apr. 6, 2010

(54) 3-DIMENSIONAL INTEGRATED CIRCUIT ARCHITECTURE, STRUCTURE AND METHOD FOR FABRICATION THEREOF

(75) Inventors: Kerry Bernstein, Underhill, VT (US); Paul W. Coteus, Yorktown Heights, NY (US); Philip G. Emma, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/127,086

(22) Filed: May 27, 2008

(65) Prior Publication Data

US 2008/0259671 A1 Oct. 23, 2008

Related U.S. Application Data

(63) Continuation of application No. 11/278,189, filed on Mar. 31, 2006, now Pat. No. 7,408,798.

(51) Int. Cl.
*G11C 5/02* (2006.01)
(52) U.S. Cl. .................. 365/51; 365/52; 365/185.27; 365/226
(58) Field of Classification Search .............. 365/51, 365/52, 185.27, 226
See application file for complete search history.

(56) References Cited

U.S. PATENT DOCUMENTS

| 5,087,585 | A | 2/1992 | Hayashi |
| 5,321,646 | A * | 6/1994 | Tomishima et al. ........... 365/51 |
| 5,426,072 | A | 6/1995 | Finnila |
| 5,877,034 | A | 3/1999 | Ramm et al. |
| 5,998,808 | A | 12/1999 | Matsuishita |
| 6,356,500 | B1 * | 3/2002 | Cloud et al. ................. 365/226 |
| 6,821,826 | B1 | 11/2004 | Chan et al. |
| 7,085,152 | B2 * | 8/2006 | Ellis et al. .................... 365/149 |
| 2007/0283298 | A1 * | 12/2007 | Bernstein et al. ............... 716/1 |

* cited by examiner

*Primary Examiner*—Pho M. Luu
(74) *Attorney, Agent, or Firm*—Scully, Scott, Murphy & Presser, P.C.; Michael J. LeStrange, Esq.

(57) ABSTRACT

An integrated circuit design, structure and method for fabrication thereof includes at least one logic device layer and at least two additional separate memory array layers. Each of the logic device layer and the at least two memory array layers is independently optimized for a particular type of logic device or memory device disposed therein. Preferably also disposed within the logic device layer are array sense amplifiers, memory array output drivers and like higher performance circuitry otherwise generally disposed within memory array layer substrates. All layers may be independently powered to provide additional performance enhancement.

15 Claims, 3 Drawing Sheets

3-DIMENSIONAL INTEGRATED CIRCUIT ARCHITECTURE, STRUCTURE AND METHOD FOR FABRICATION THEREOF

RELATED APPLICATION

This application is a continuation of U.S. Ser. No. 11/278,189, filed Mar. 31, 2006, now U.S. Pat. No. 7,408,798.

BACKGROUND

1. Field of the Invention

The invention relates generally to integrated circuit architectures (i.e., designs), and related integrated circuit structures and methods for fabrication thereof. More particularly, the invention relates to enhanced performance integrated circuit architectures, and related integrated circuit structures and methods for fabrication thereof.

2. Description of the Related Art

Modern semiconductor circuits often integrate circuit types or components, such as transistors, resistors and capacitors, for which different types of performance characteristics are desirably optimized. For example, field effect transistors that are used within logic circuits may desirably be optimized to provide enhanced integrated circuit speed. In comparison, storage capacitors used in dynamic memory circuits may alternatively be optimized to provide enhanced charge storage capacity.

The optimization of performance characteristics of various semiconductor circuits and semiconductor devices often leads to competing processing requirements. Thus, a need exists for integrated circuit designs and resulting structures that efficiently allow for optimization of various integrated circuit and device types.

Semiconductor structures, and methods for fabrication thereof, that include individually optimized devices and components are known in the semiconductor fabrication art. For example, Chan et al., in U.S. Pat. No. 6,821,826, teaches a three-dimensional complementary metal oxide semiconductor (CMOS) structure having separate field effect transistor (FET) devices fabricated upon different crystallographic orientation semiconductor substrates. The different crystallographic orientations provide for optimization of charge carrier mobility within the separate field effect transistors.

Semiconductor circuit fabrication is certain to continue to require enhanced levels of performance and optimization of various semiconductor circuits and devices within reduced semiconductor substrate surface area. Thus, integrated circuit and semiconductor architectures, structures and methods for fabrication thereof that provide for such ready optimization are desirable.

SUMMARY OF THE INVENTION

The invention provides an integrated circuit architecture (i.e., a design), a related integrated circuit structure and a related method for fabricating the integrated circuit structure.

Each of the architecture, structure and method includes: (1) a first memory array disposed, located or formed upon a first substrate layer and having a first performance and power specification; (2) a second memory array different from the first memory array and disposed, located or formed upon a second substrate layer different from the first substrate layer and having a second power and performance specification different from the first power and performance specification; and (3) a plurality of logic circuit elements disposed, located or formed upon a third substrate layer coupled to the first memory array and the second memory array. The foregoing dispositions of the first memory array, second memory array and plurality of logic elements upon separate substrate layers allows for individual optimization of the devices or circuits that comprise the first memory array, the second memory array and the plurality of logic circuit elements.

More specifically, an integrated circuit architecture in accordance with the invention includes a first array of first memory devices disposed on a first substrate layer, where the first memory devices have a first power and performance specification. The integrated circuit architecture also includes a second array of second memory devices different from the first array disposed on a second substrate layer different from the first substrate layer, where the second memory devices have a second power and performance specification different from the first power and performance specification. The integrated circuit architecture also includes a plurality of logic devices disposed on a third substrate layer, where the plurality of logic devices is coupled to the first array and the second array.

An integrated circuit structure in accordance with the invention correlates with the integrated circuit architecture. The integrated circuit structure includes a first array of first memory devices located on a first substrate layer, where the first memory devices have a first power and performance specification. The integrated circuit structure also includes a second array of second memory devices different from the first array located on a second substrate layer different from the first substrate layer, where the second memory devices have a second power and performance specification different from the first power and performance specification. The integrated circuit structure also includes a plurality of logic devices located on a third substrate layer, where the plurality of logic devices is coupled to the first array and the second array.

A method for fabricating an integrated circuit in accordance with the invention includes forming a first array of first memory devices on a first substrate layer, where the first memory devices have a first power and performance specification. The method also includes forming a second array of second memory devices different from the first array on a second substrate layer different from the first substrate layer, where the second memory devices have a second power and performance specification different from the first power and performance specification. The method also includes forming a plurality of logic devices on a third substrate layer. Finally, the method includes coupling the first array, the second array and the plurality of logic devices.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The embodiments and the invention, which include an integrated circuit architecture, a related integrated circuit structure and a related method for fabrication thereof, are described in greater detail below within the context of the drawings described above. The drawings are intended for illustrative purposes, and as such they are not necessarily drawn to scale.

Figure 1:
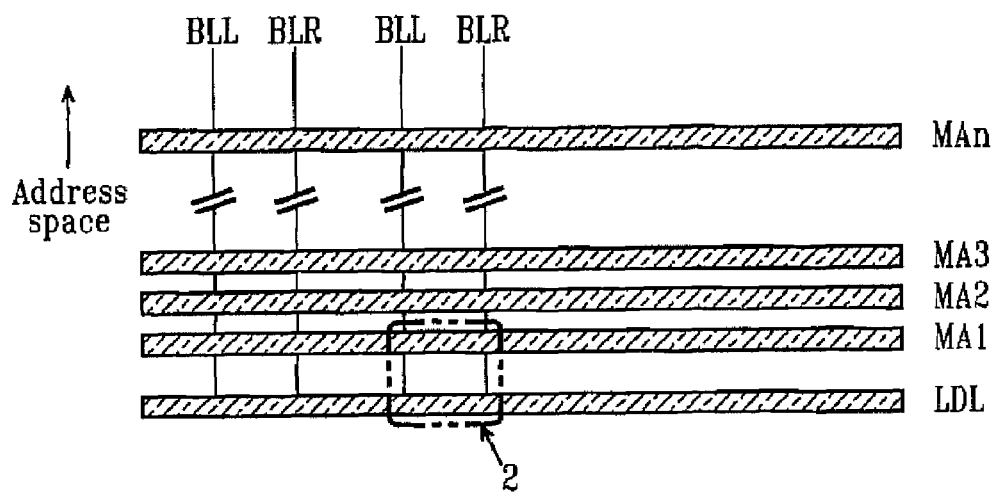
FIG. 1 and FIG. 2 show a pair of schematic diagrams illustrating an integrated circuit architecture in accordance with the invention.

FIG. 1 shows a schematic diagram of an integrated circuit architecture that comprises an aspect and embodiment of the invention.

The integrated circuit architecture first comprises a logic device layer LDL (i.e., at least one logic device layer). The logic device layer LDL is intended to comprise a substrate or a substrate layer that includes logic devices located, disposed and formed therein. Logic devices are typically transistors, more typically field effect transistors. However, the invention is not limited to a logic device layer LDL that comprises only field effect transistors. Rather, other types of logic devices, including in particular bipolar transistors and bipolar-complementary metal oxide semiconductor (BiCMOS) transistors, are not excluded within the context of the instant embodiment or within the context of the invention.

The embodiment and the invention contemplate that the substrate for the logic device layer LDL will typically be a semiconductor substrate or a semiconductor layer, although the same is also not a requirement of the invention. Rather the embodiment and the invention also contemplate use of dielectric substrates when fabricating logic devices thereupon to form a logic device layer LDL. Within the context of the foregoing circumstances, the logic devices may be thin film logic devices located, disposed and formed upon dielectric substrates.

The embodiment and the invention also contemplate that memory arrays may be embedded within the logic device layer LDL. These memory arrays will of necessity utilize higher performance logic technology that is described above and optimized for high speed support functions of array peripherals within the logic device layer LDL (i.e., a different power and performance specification than memory arrays described below). This higher performance logic technology would generally, if not necessarily, utilize higher performance logic technology that may compromise performance (i.e., cell stability and related parameters) of a memory array.

Located architecturally (but not necessarily physically) above the logic device layer LDL within the schematic diagram of FIG. 1 is a series of memory arrays MA1, MA2, MA3 and MAn. Each of the memory arrays MA1, MA2, MA3 and MAn is intended as comprising a single type of memory device located, disposed and formed on a substrate or a substrate layer that is separate from an other of the memory arrays MA1. MA2, MA3 or MAn, or the logic device layer LDL.

Non-limiting examples of individual memory device types contemplated by the embodiment and the invention include dynamic random access memory (DRAM) devices, synchronous random access memory (SRAM) devices, magnetic random access memory (MRAM) devices, flash memory devices, other volatile memory devices and other non-volatile memory devices. Analogously with the logic devices located, disposed and formed within the logic device layer LDL, the memory devices located, disposed and formed within the memory array layers MA1, MA2, MA3 and MAn are also optimized with respect to at least one operational parameter or physical parameter.

For example, for a DRAM device the operational parameter might be an adequate storage capacitance. Alternatively, a refresh rate might also be an appropriate operational parameter for a DRAM device. An SRAM device might alternatively benefit from enhanced noise immunity and cell stability. In comparison, logic devices will generally benefit from enhanced speed, which is often realized within the context of a minimum resolvable channel width.

FIG. 1 also shows two pair of bitlines comprising one left bitline BLL and one right bitline BLR that are used to couple and connect the memory arrays MA1, MA2, MA3 and MAn with the logic device layer LDL. Typically, the embodiment and the invention intend that the memory arrays MA1, MA2, MA3 and MAn and the logic device layer LDL comprise a stack of layers or substrates, and in particular an aligned stack of layers or substrates.

Figure 2:
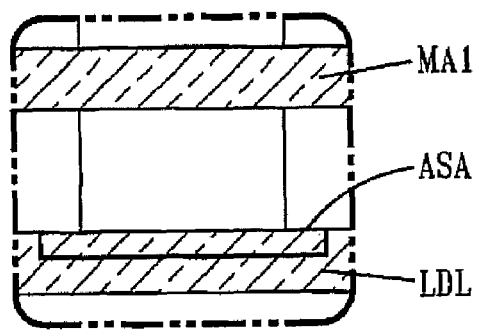

FIG. 2 shows an expanded view of an interface between the logic device layer LDL and the memory array MA1. FIG. 2 in particular shows that array sense amplifier (ASA) (including memory array output drivers) for a specific memory technology that is fabricated within the first memory array MA1 is located within the logic device layer LDL rather than the first memory array MA1. In certain other integrated circuit architectures such array sense amplifiers are located embedded within the memory array whose stored data it is intended to amplify.

Although not specifically illustrated in FIG. 1 or FIG. 2, the embodiment and the invention also at least implicitly assume that the logic device layer LDL and each of the memory arrays MA1, MA2, MA3 and MAn may be powered by a unique and distinct operating voltage and operating current (i.e., unique power supplies). Each of the unique and distinct operating voltages and operating currents may clearly also be optimized with respect to individual devices and device types within each of the specific memory arrays MA1, MA2, MA3 or MAn, or the logic device layer LDL.

Methods for fabricating an integrated circuit structure, or more particularly a semiconductor structure, in accordance with the foregoing integrated circuit architecture may derive from methods that are otherwise generally known in the integrated circuit fabrication art or the semiconductor fabrication art.

Commonly, although not exclusively, the methods comprise layer transfer methods that use a substrate as a means for transferring either partially or fully fabricated integrated circuit layers and laminating the same in a stack type structure. Specific examples of resulting structures and related methods are taught within: (1) Hayashi in U.S. Pat. No. 5,087,585 (a thin film layering method); (2) Finilla in U.S. Pat. No. 5,426,072 (a layering method that uses silicon-on-insulator (SOI) substrates); (3) Ramm et al., in U.S. Pat. No. 5,877,034 (a method that utilizes lateral placement of fabricated chips); (4) Matsushita in U.S. Pat. No. 5,998,808 (a method that includes sequential bonding of monocrystalline silicon layers having devices formed therein); and (5) Chan et al., in U.S. Pat. No. 6,821,826 (a method that includes laminating of semiconductor layers of different crystallographic orientation). The teachings of the foregoing references are incorporated herein fully by reference.

An illustrative example of a method for fabricating an integrated circuit structure in accordance with the invention is shown by the schematic cross-sectional diagrams of FIG. 3 to FIG. 7.

Figure 3:
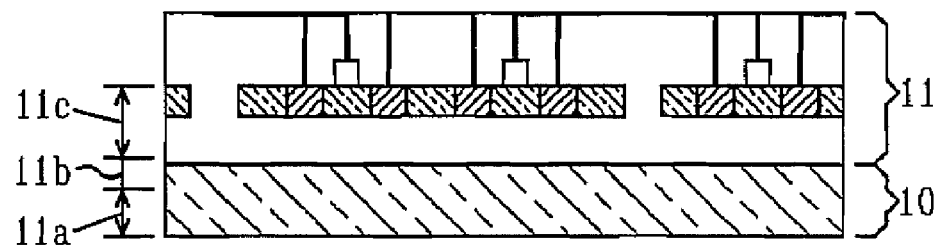
FIG. 3 to FIG. 7 show a series of schematic cross-sectional diagrams illustrating the results of progressive stages of implementing the integrated circuit architecture of FIG. 1 and FIG. 2 within the context of an integrated circuit structure.

FIG. 3 shows an integrated circuit structure that comprises a substrate 10 and a first performance layer 11 located thereupon. The first performance layer 11 further comprises a first dielectric spacer layer 11a, a first device layer 11b located thereupon and a first dielectric isolated interconnect layer 11c located thereupon.

Each of the foregoing substrate 10 and layers 11/11a/11b/11c may comprise materials and have dimensions that are conventional in the integrated circuit fabrication art. Each of the foregoing substrate 10 and layers 11/11a/11b/11c may also be formed using methods that are conventional in the integrated circuit fabrication art.

The substrate 10 may comprise a conductor material, a semiconductor material or a dielectric material. Conductor materials are not particularly common. Dielectric materials may include certain ceramic materials as well as glasses. Silica, alumina, titania and zirconia materials are common, as well as laminates thereof and composites thereof.

More commonly, the substrate comprises a semiconductor material. Semiconductor materials may include, but are not limited to: silicon, germanium, silicon-germanium alloy, silicon carbide and silicon-germanium carbide alloy semiconductor materials. In addition, semiconductor materials may also include compound (II-VI and III-V) semiconductor materials of which gallium arsenide, indium arsenide and indium phosphide are non-limiting examples.

The structural aspects and embodiment of the invention contemplate the use of bulk semiconductor substrates, semiconductor-on-insulator substrates and hybrid orientation substrates. Semiconductor-on-insulator substrates comprise a base semiconductor substrate, a buried dielectric layer located thereupon and a surface semiconductor layer located further thereupon. Hybrid orientation substrates include multiple semiconductor regions of different crystallographic orientation.

Typically, the substrate 10, whether comprising a semiconductor material or an alternative material, has a thickness from about 1 to about 3 mils.

The first dielectric spacer layer 11a may comprise any of several dielectric materials. Non-limiting examples include oxides, nitrides and oxynitrides of silicon, which generally have a dielectric constant from about 4 to about 20, measured in vacuum. Oxides, nitrides and oxynitrides of other elements are not excluded. Also included are generally lower dielectric constant dielectric materials having a dielectric constant from about 2 to about 4, also measured in vacuum. Dielectric materials with dielectric constants in this range may comprise aerogels, hydrogels, fluorine doped dielectric materials, carbon doped dielectric materials, spin-on-glass materials, organic polymer materials and fluorinated organic polymer materials.

The first dielectric spacer layer 11a may be formed using any of several methods that are appropriate to its material{s} of fabrication. Non-limiting examples include thermal or plasma oxidation or nitridation methods, spin-on methods, chemical vapor deposition methods and physical vapor deposition methods. Typically, the first dielectric spacer layer 11a comprises at least in part a silicon oxide material. In addition, the first dielectric spacer layer 11a typically has a thickness from about 100 to about 10000 angstroms.

The first device layer 11b generally comprises semiconductor devices that are located, disposed and formed within a semiconductor layer. The invention is not however so limited. The first device layer 11b may comprise a semiconductor material that is either the same or different from the semiconductor material from which may be comprised the substrate 10. The first device layer 11b may be either the same or different with respect to semiconductor composition, crystallographic orientation and dopant concentration. Typically the first device layer 11b has semiconductor devices located therein that are optimized in accordance with the architectural aspects and embodiment of the invention. The semiconductor devices may include, but are not limited to transistors, resistors, diodes and capacitors.

The first dielectric isolated interconnect layer 11c may comprise generally conventional or generally unconventional metallization materials and dielectric materials. Generally conventional metallization materials include non-refractory and refractory metals and metal alloys, such as, but not limited to: aluminum, copper, tungsten, titanium, tantalum and vanadium. Also included are appropriate nitrides and silicides that need not necessarily derive from the foregoing metals and metal alloys.

Dielectric materials may include the same dielectric materials from which may be comprised the first dielectric spacer layer 11a. Typically, the first dielectric isolated interconnect layer 11c has a thickness from about 1000 to about 5000 angstroms.

Figure 4:
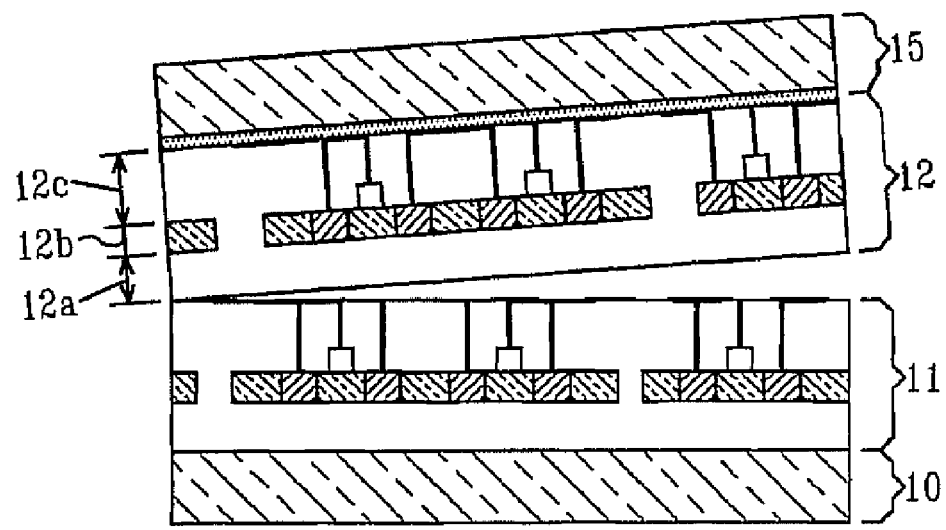

FIG. 4 shows the results of an initial process step that is directed towards laminating a second performance layer 12 upon the first performance layer 11 whose schematic cross-sectional diagram is illustrated in FIG. 3.

As is illustrated in FIG. 4, the second performance layer 12 is laminated, with an inverted ordering, to a carrier substrate 15 that includes an adhesive interfacial surface. The carrier substrate 15 may comprise a conductor material, a semiconductor material or a dielectric material. The adhesive interfacial surface interposed between the carrier substrate 15 and the second performance layer 12 may comprise any of several adhesive materials. Polymeric adhesive materials are particularly common, but do not limit the invention.

As is additionally specifically illustrated by sub-layer designations, the integrated circuit structure that is illustrated in FIG. 4 clearly intends that the second performance layer 12 comprises in upwardly progressing order: (1) a second dielectric spacer layer 12a; (2) a second device layer 12b located upon the second dielectric spacer layer 12a; and (3) a second dielectric isolated interconnect layer 12c located upon the second device layer 12b.

Figure 5:
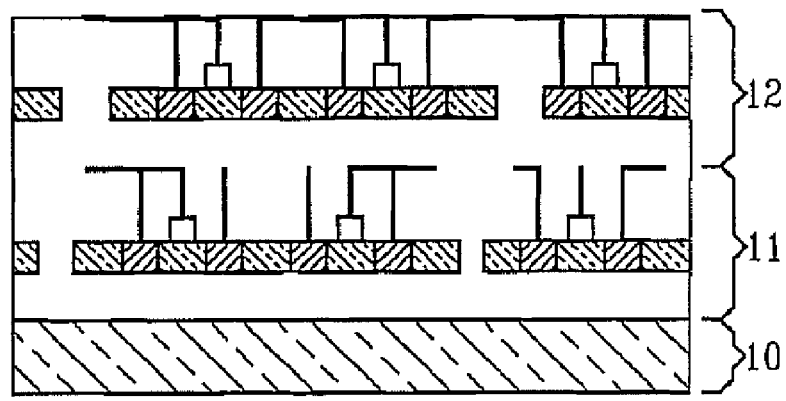

FIG. 5 shows the results of a complete laminating of the integrated circuit structure whose schematic cross-sectional diagram is illustrated in FIG. 4, followed by the subsequent removal of the carrier substrate 15 including the adhesive interfacial surface.

The complete laminating is generally undertaken using a pressure laminating method. Laminating methods that use adhesive material interposed between the first performance layer 11 and the second performance layer 12 are not excluded. They may be used as an adjunct or an alternative to a pressure laminating method.

The carrier substrate 15 may be delaminated to provide the integrated circuit structure of FIG. 5 while using any of several methods. Included are a particularly simple delaminating method that may use a peeling action. Also contemplated are radiation assisted delamination methods that use radiation to assist in release at the interface of the adhesive surface of the carrier substrate 15 with the second performance layer 12.

Figure 6:
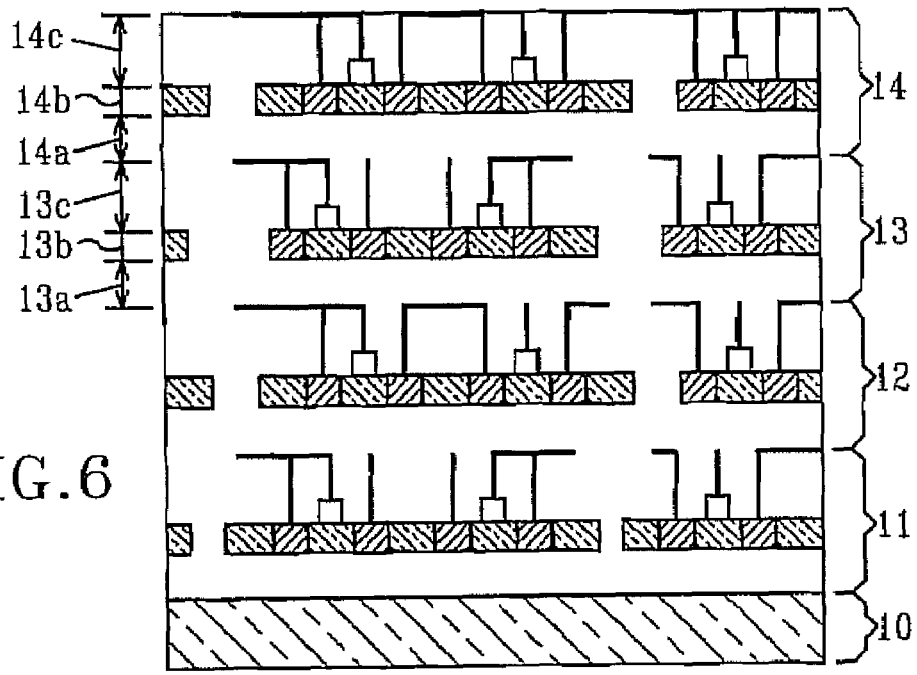

FIG. 6 shows a schematic cross-sectional diagram illustrating the results of further processing of the integrated circuit structure whose schematic cross-sectional diagram is illustrated in FIG. 5.

FIG. 6 shows the results of two additional iterations of the laminating processing that is illustrated in the schematic cross-sectional diagram of FIG. 3, to yield an integrated circuit structure that further comprises a third performance layer 13 laminated to the second performance layer 12, and a fourth performance layer 14 laminated to the third performance layer 13.

In concert with the first performance layer 11 and the second performance layer 12, the third performance layer 13 comprises: (1) a third dielectric spacer layer 13a; (2) a third device layer 13b located upon the third dielectric spacer layer 13a; and (3) a third dielectric isolated interconnect layer 13c located upon the third device layer 13b. Similarly, the fourth performance layer 14 comprises: (1) a fourth dielectric spacer layer 14a; (2) a fourth device layer 14b located upon the fourth dielectric spacer layer 14a; and (3) a fourth dielectric isolated interconnect layer 14c located upon the fourth device layer 14b.

Figure 7:
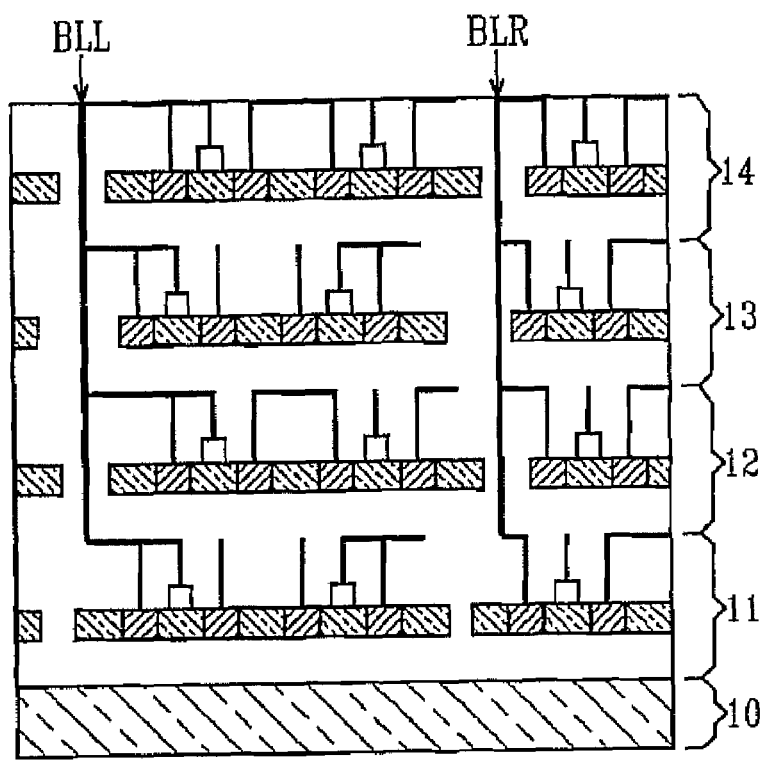

FIG. 7 shows the results of further processing of the integrated circuit structure whose schematic cross-sectional diagram is illustrated in FIG. 6.

FIG. 7 shows a left bitline BLL and a right bitline BLR located interconnecting the first performance layer 11, the second performance layer 12, the third performance layer 13 and the fourth performance layer 14 through their respective dielectric isolated interconnection layers 11c, 12c, 13c and 14c.

The left bitline BLL and the right bitline BLR may be formed using methods that are conventional in the integrated circuit fabrication art, and in particular the semiconductor fabrication art. Such methods will generally include forming a via through aligned dielectric layers within the fourth, third, second and first performance layers 14/13/12/11 so that the via exposes portions of dielectric isolated interconnect layers 14a/13a/12a/11a within the corresponding fourth performance layer 14, the third performance layer 13, the second performance layer 12 and the first performance layer 11. The via may then be backfilled with a suitable optional barrier layer and also a conductor layer. Excess portions of the barrier layer and conductor layer that are located upon an upper surface of the integrated circuit structure whose schematic cross-sectional diagram is illustrated in FIG. 7 may be planarized using methods that are conventional in the integrated circuit fabrication art. Such methods may include, but are not limited to mechanical planarizing methods, and chemical mechanical polish planarizing methods. Chemical mechanical polish planarizing methods are considerably more common.

Within FIG. 7, any one of the first performance layer 11, the second performance layer 12, the third performance layer 13 and the fourth performance layer 14 may comprise a logic device layer LDL in accordance with the architectural aspect and embodiment of the invention, as illustrated in FIG. 1. Similarly each of the remaining three of the first performance layer 11, the second performance layers 12, the third performance layer 13 and the fourth performance layer 14 may comprise any one (i.e., single) of the first memory array MA1, second memory array MA2, third memory array MA3 and last memory array MAn.

Thus, the integrated circuit structural aspect and embodiment of the invention does not discriminate with respect to a location of a logic device layer LDL with respect to any one of a first memory array MA1, second memory array MA2, third memory array MA3 or last memory array MAn.

From a practical perspective, the integrated circuit structural aspect and embodiment of the invention might find desirable to locate one of the logic device layer LDL and the memory arrays MA1, MA2, MA3 and MAn that is most likely to generate heat closest to a heat sink or other heat dissipation structure or layer within an integrated circuit structure. Such a specific location will depend upon further structural considerations within the context of the integrated circuit structure whose schematic cross-sectional diagram is illustrated in FIG. 7.

The preferred embodiments of the invention are illustrative of the invention rather than limiting of the invention. Revisions and modifications may be made to architectures, structures, methods, materials and dimensions of an integrated circuit architecture, structure and method for fabrication thereof in accordance with the preferred embodiments of the invention, while still providing an embodiment in accordance with the invention, further in accordance with the accompanying claims.

What is claimed is:

1. An integrated circuit architecture comprising:
   a first array of first memory devices disposed on a first substrate layer, the first memory devices having a first power and performance specification;
   a second array of second memory devices different from the first array disposed on a second substrate layer different from the first substrate layer, the second memory devices having a second power and performance specification different from the first power and performance specification; and
   a plurality of logic devices disposed on a third substrate layer, the plurality of logic devices being coupled to the first array and the second array.

2. The integrated circuit architecture of claim 1 further comprising a plurality of array sense-amp and memory array output drivers disposed on the third substrate layer and designed to interface with the first array and the second array.

3. The integrated circuit architecture of claim 1 wherein the first substrate layer, the second substrate layer and the third substrate layer are stacked.

4. The integrated circuit architecture of claim 1 wherein the first array of first memory devices comprises a series of devices selected as one from the group consisting of DRAM, SRAM, MRAM, flash memory, other volatile memory and other non-volatile memory devices.

5. The integrated circuit architecture of claim 4 wherein the second array of second memory devices comprises an other series of devices selected as an other from the group consisting of DRAM, SRAM, MRAM, flash memory, other volatile memory and other non-volatile memory devices.

6. The integrated circuit architecture of claim 1 wherein:
   the third substrate layer further comprises a third array of third memory devices different from the second array of second memory devices and the first array of first memory devices, the third array of third memory devices having a third power and performance specification consistent with the plurality of logic devices.

7. The integrated circuit architecture of claim 1 further comprising a separate power supply for each of the first array, the second array and the plurality of logic devices.

8. An integrated circuit structure comprising:
   a first array of first memory devices located on a first substrate layer, the first memory devices having a first power and performance specification;
   a second array of second memory devices different from the first array located on a second substrate layer different from the first substrate layer, the second memory devices having a second power and performance specification different from the first power and performance specification; and
   a plurality of logic devices located on a third substrate layer, the plurality of logic devices being coupled to the first array and the second array.

9. The integrated circuit structure of claim 8 further comprising a plurality of array sense-amp and memory array output drivers located on the third substrate and interfaced with the first array and the second array.

10. The integrated circuit structure of claim 8 wherein the first substrate layer, the second substrate layer and the third substrate layer comprise a stack.

11. The integrated circuit structure of claim 8 wherein the first array of first memory devices comprises a series of devices selected as one from the group consisting of DRAM, SRAM, MRAM, flash memory, other volatile memory and other non-volatile memory devices.

12. The integrated circuit structure of claim 11 wherein the second array of second memory devices comprises an other series of devices selected as another from the group consisting of DRAM, SRAM, MRAM, flash memory, other volatile memory and other non-volatile memory devices.

13. The integrated circuit structure of claim 8 wherein the plurality of logic devices has a minimum channel width.

14. The integrated circuit structure of claim 8 further comprising a bitline for coupling the first array, the second array and the plurality of logic devices.

15. The integrated circuit structure of claim 8 further comprising a separate power supply for each of the first array, the second array and the plurality of logic devices.

* * * * *

UNITED STATES PATENT AND TRADEMARK OFFICE
CERTIFICATE OF CORRECTION

Page 1 of 1

| | |
|---|---|
| PATENT NO. | : 7,692,944 B2 |
| APPLICATION NO. | : 12/127086 |
| DATED | : April 6, 2010 |
| INVENTOR(S) | : Bernstein et al. |

It is certified that error appears in the above-identified patent and that said Letters Patent is hereby corrected as shown below:

In the Specification

Column 1, Line 3-4, please add the below statement as the first line in the above patent application.

--This invention was made with Government support under Contract No.: N66001-04-C-8032 awarded by Defense Advanced Research Projects Agency (DARPA). The Government has certain rights in this invention.--.

Signed and Sealed this
Seventeenth Day of March, 2015

Michelle K. Lee
*Director of the United States Patent and Trademark Office*